US006285552B1

(12) United States Patent
Adachi

(10) Patent No.: US 6,285,552 B1
(45) Date of Patent: Sep. 4, 2001

(54) RECTIFIER OF AN ALTERNATING CURRENT GENERATOR FOR VEHICLE

(75) Inventor: Katsumi Adachi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/459,608

(22) Filed: Dec. 13, 1999

(30) Foreign Application Priority Data

May 27, 1999 (JP) .................................................. 11-147805

(51) Int. Cl.⁷ ...................................................... H05K 7/20
(52) U.S. Cl. ........................ 361/705; 165/80.2; 165/80.3; 165/185; 174/16.3; 257/713; 361/705; 361/707; 363/145
(58) Field of Search ................................. 165/80.2, 80.3, 165/185; 174/16.3; 257/707, 713, 720; 361/704–708, 807, 809–810; 363/145

(56) References Cited

U.S. PATENT DOCUMENTS 4,546,409 * 10/1985 Yoshino et al. ........................ 361/707
4,701,828 * 10/1987 Weiner ................................. 361/707
5,828,564 * 10/1998 Mori et al. ............................ 363/145

FOREIGN PATENT DOCUMENTS 6-67194    8/1994 (JP) .

* cited by examiner

Primary Examiner—Gregory Thompson
(74) Attorney, Agent, or Firm—Sughrue, Mion, Zinn, Macpeak & Seas, PLLC

(57) ABSTRACT

A heat sink of an alternating current generator for a vehicle has a heat sink body formed from aluminum die-cast. An insert member is provided on the heat sink body and a diode is provided on the insert member. The insert member (1) surrounds the side walls of the diode, (2) is (a) a metal having a good solderability other than aluminum or (b) a metal having a good solderability adhered onto a base metal other than aluminum, and (3) provides a solder connection between the diode and the heat sink body.

4 Claims, 6 Drawing Sheets

RECTIFIER OF AN ALTERNATING CURRENT GENERATOR FOR VEHICLE

BACKGROUND OF THE INVENTION

1. Field of the Invention

The present invention relates to a rectifier for an alternating current generator for a vehicle and particularly relates to an arrangement of heat sink for supporting diodes of the rectifier.

2. Description of the Prior Art

FIG. 4 is sectional view showing a conventional alternating current generator for a vehicle and the alternating current generator consists of a case consisting of a front bracket 1 and a rear bracket 2 made of aluminum, a shaft 6 being disposed in the case 3 and having a pulley 4 being fixed at an end of the shaft 6, a rundle type rotor 7 secured to the shaft 6, fans 5 fixed at both side surfaces of the rotor 7, a stator 8 fixed to an inner wall within the case 3, slip rings 9 being fixed to another end of the shaft 6 and for supplying electricity to the rotor 7, a pair of brushes which slide on the slip rings 9, brush holders 11 for storing the brushes 10, a rectifier 12 being electrically connected to the stator 8 and for rectifying the alternating current generated through the stator to a direct current, a heat sink 17 fit to the brush holder 11, and a regulator being bonded to the heat sink 17 and for regulating the magnitude of the alternating current voltage generated through the stator.

The rotor 7 consists of a rotor coil 13 for producing a magnetic flux by supplying electric current therethrough and a pole core 14 being arranged to cover the coil 13 and for producing magnetic poles due to the magnetic flux passing through the core 14. The pole core consisting of mutually mated first core 21 and second core 22, and those cores 21 and 22 are made of iron and have claw shaped magnetic poles 23 and 24 respectively.

The stator 8 has a stator core 15 and stator coils 16 wound around the stator core 15. The stator 8 generates the alternating current through the stator coils 16 due to the variation of the magnetic flux from the rotor coil 13 produced as a result of rotation of the rotor 7.

As shown by FIG. 5, the rectifier 12 consists of heat sinks 25 for supporting a plurality of diodes 26 on the plus side and heat sinks 27 for supporting a plurality of diodes 28 on the minus side. The plus side heat sink 25 has fins 25a. The plus side heat sink 25 and fins 25a are formed to be a single body, and the minus side heat sink 27 shares function of earth and is directly connected to the rear bracket 2.

The heat sinks 25, 27 are formed to be horseshoe shaped from the material such as ADC10 and ADC12 by means of aluminum die-casting.

On account of space efficiency, those diodes 26 and 28 are secured by means such as soldering on the heat sinks 25, 27 with an optimum positioning securing a good thermal conduction.

Also another arrangement can be seen such that diodes are fixed and supported so that their longitudinal directions come out to be in parallel with respective axes of the heat sinks and the fins of the heat sinks of both sides of plus and minus are placed being perpendicular to that axes.

In the alterating current generator mentioned as above, the magnetix flux is produced by supplying electric current through the rotor coil 13 through the slip rings 9, and by this magnetic flux, the claw shaped magnetic pole 23 of the first core body 21 is magnetized to N pole and the claw shaped magnetic pole 24 of the second magnetic body is magnetized to S pole.

On the other hand, because the pulley 4 is driven by the engine and the rotor 7 is rotated by the shaft 6, a rotating magnetic filed is applied to the stator coil 16 resulting in a generation of an electromagnetic force corresponding to the variation of the magnetic field. This electromotive force is rectified by the rectifier 12 to a direct current and its magnitude is regulated by the regulator 18 and the electricity is charged to unshown battery.

The cooling air stream produced by the fan 5 rotated by the shaft 6 are taken into the interior of the case 3 from the air intake port 1a, 2a of the front bracket 1 and the rear bracket 2, respectively and on the rear side the air stream passes through heat generating members such as the rectifier 12 and regulator 18 and cools those heat generating members and also passes through the fan 5 from its inner radius side to its outer radius side and cools front end and rear end of the stator coil 16 and is exhausted from the exhaust port 1b and 2b of the front bracket 1 and the rear bracket 2, respectively.

Heat sinks 25 and 17 of the rectifier 12 and the regulator 18 those of which have high degree of heat generation and affect output performance due to high temperature, in order to promote heat dissipation, are provided with fins 25a and 17a, respectively and are adapted to introduce cooling air stream thereinto.

Among the heat sinks of the rectifier 12, the minus side heat sink 27 has no fins but the air intake port 2a on the side of grownded rear bracket 2 serves as fins of heat sink 27 mentioned as above, and thus the same cooling is performed.

Now in the conventional rectifier as mentioned above, in order to improve thermal conductivity, productivity and reliability, respective diodes were fixed to heat sinks by soldering after forming a metal coating layer (meshed portion in the drawings) having a good solderability such as Ni plating on to the surface of heat sink 27, 25 of aluminum die-cast as shown by FIGS. 6(a), (b). Though the portions to be coated which is actually necessary for soldering are limited merely to the recessed portion 25b, 27a for fixation of diodes, for consideration of reasons such as coating process the heat sink body being kept intact is diped into a coating solution bath and thus whole heat sinks 27, 25 are obliged to be coated.

On the other hand, because of generation of high calorific value by diodes 26, 28 due to a sustained continuous electric current during generations of electricity by the generator, as the number of diodes increases the cooling function is maintained by correspondingly enlarging the heat sinks for cooling. To perform heat dissipation correspondingly to the increased calorific value, total area of fins are arranged to be increased by diminishing pitch of the fins 25a and increasing the number of fins.

Accordingly, fin portion which is not required to be coated increases apace.

Thus as seen in the conventional heat sinks, when whole heat sinks 27, 25 are coated, the area, which must be coated but is not necessary to be served for soldering, is further increased and thus there gives rise to a problem of raising up the surface treatment cost rapidly.

SUMMARY OF THE INVENTION

The present invention is made in order to solve forgoing problems and an object of the invention is to from merely a coating layer being necessary for soldering on to the heat sink of the rectifier of the alternating current generator for a vehicle.

In the rectifier of an alternating current as recited in claim 1 of the present invention, at least a portion of each of the heat sinks, to which a diode is soldered, is formed to be a member consisting of a metal having a good solderability other than aluminum or consisting of a metal having a good solderability being adhered on to a metal other than aluminum and said heat sinks are formed by insert die-cast with the members served as insert members.

In a rectifier of a alternating current generator as recited in claim 2, the insert members are formed by adhesively coating a metal having a good solderability on to a hyper-eutectic aluminum having a melting point higher than that of aluminum die-cast of heat sink body.

BRIEF DESCRIPTION OF THE ACCOMPANYING DRAWINGS

FIGS. 1(a), (b) are general views of the heat sink of the alternating current generator for a vehicle according to the Embodiment 1 of the present invention.

FIGS. 2 (a), (b) are general views of the heat sink of the alternating current generator for a vehicle according to the Embodiment 1 of the present invention.

Figure 6A:
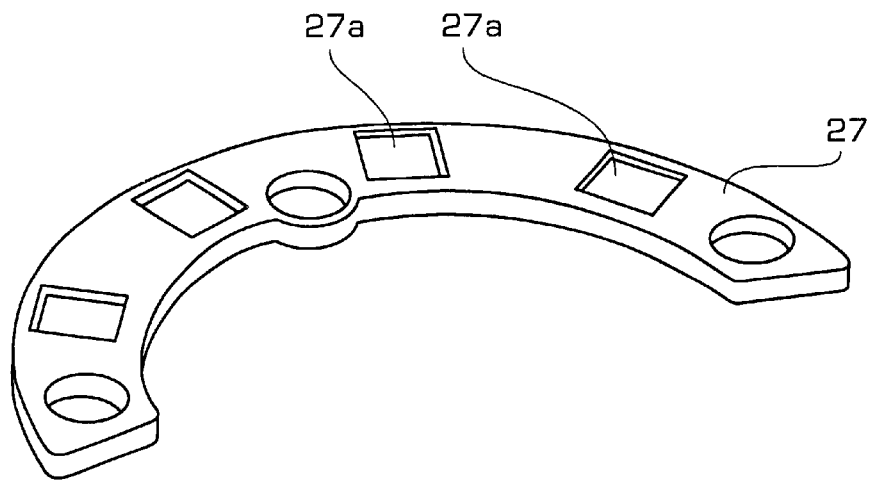
Figure 6B:
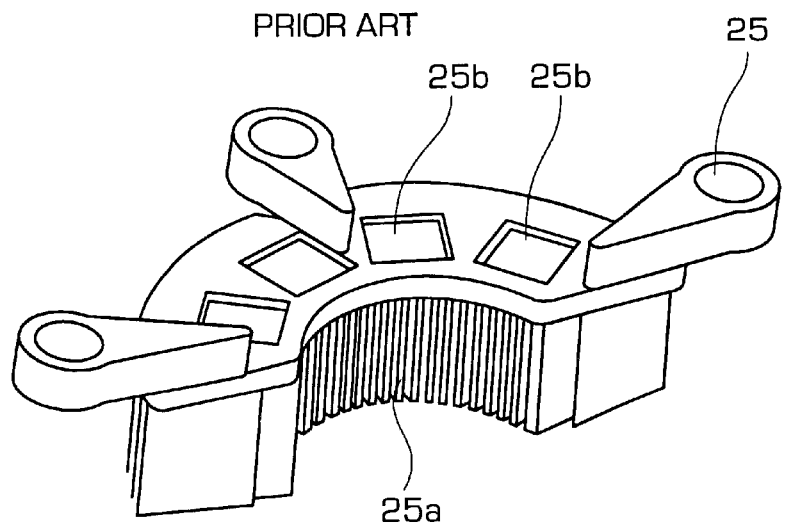

FIGS. 6(a), (b) are general views showing a conventional rectifier.

DETAILED DESCRIPTION OF THE PREFERRED EMBODIMENTS

Description will be given on the Embodiments with reference to drawings.

Embodiment 1

Figure 1A:
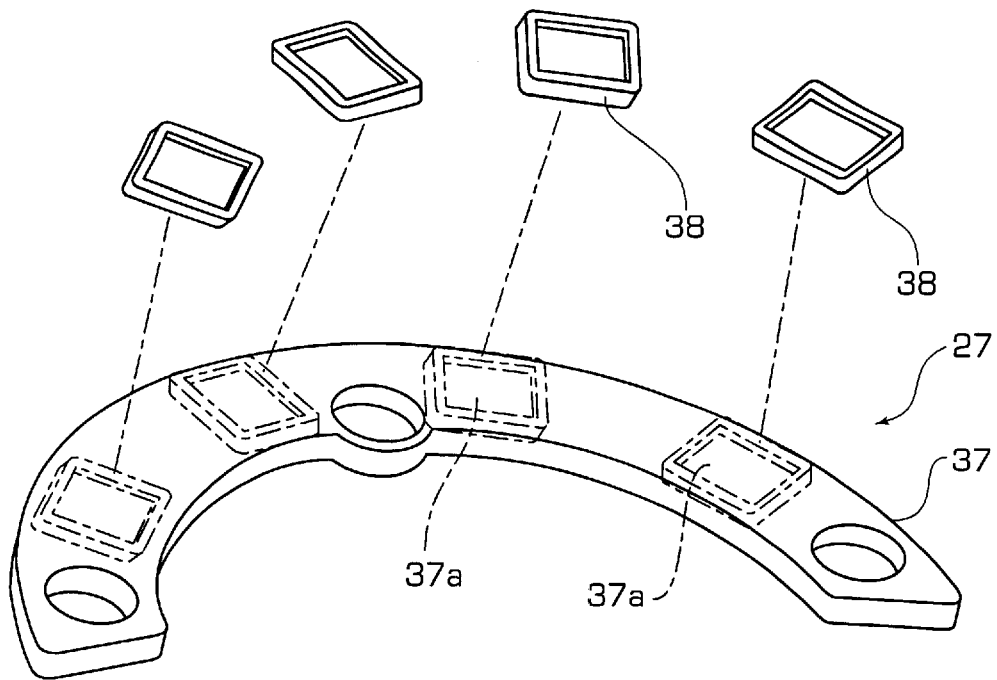

FIG. 1(a) shows an outline of method of forming the heat sink 27 on the side of the minus side of the rectifier of alternating current generator for a vehicle according to the Embodiment 1 of the present invention: 37 is a heat sink body, 38 are insert members and they are a square shaped containers consisting of material having a melting point higher than that of material constituting the heat sink body 37 such as ADC10 and ADC12, and the surface of the square shaped containers are plated with metal having good solderalibity such as Ni and Cu other than aluminum. By arranging the insert members 38 correspondingly to the arrangement of diodes already positioned on the minus side and by forming the heat sink body 37 through aluminum die casting, the minus side heat sink 27 having recessed portions 37a for attachment being coated with a metal having a good solderability other than aluminum as mentioned above can be obtained.

Figure 1B:
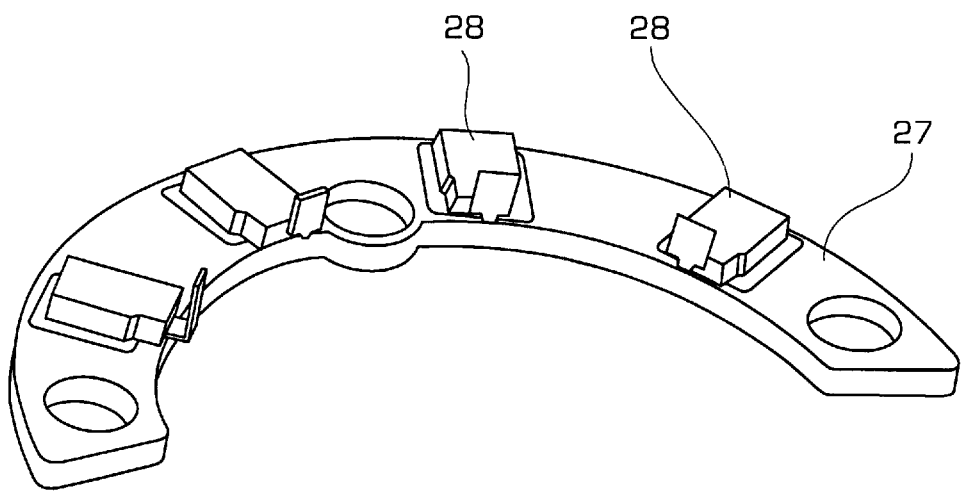

As shown FIG. 1(b) into respective attachment recessed portions 37a of the minus side heat sink 27, respective minus side diodes 28 are inserted and soldered and thus the minus side diodes 28 are fixed to the minus side heat sink 27.

Figure 2A:
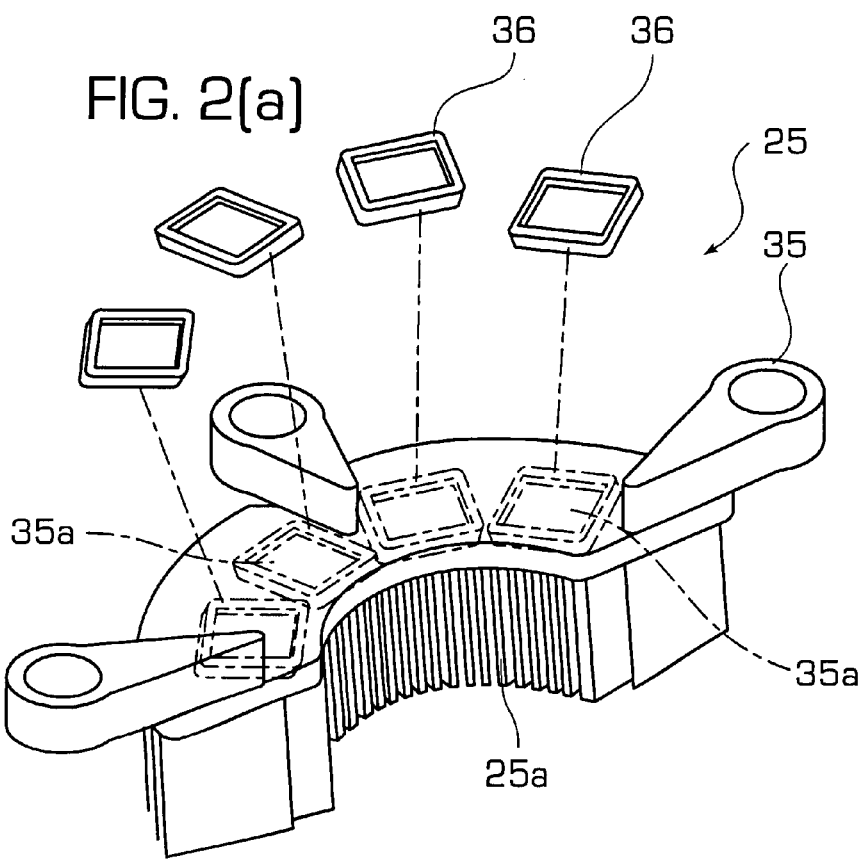
Figure 2B:
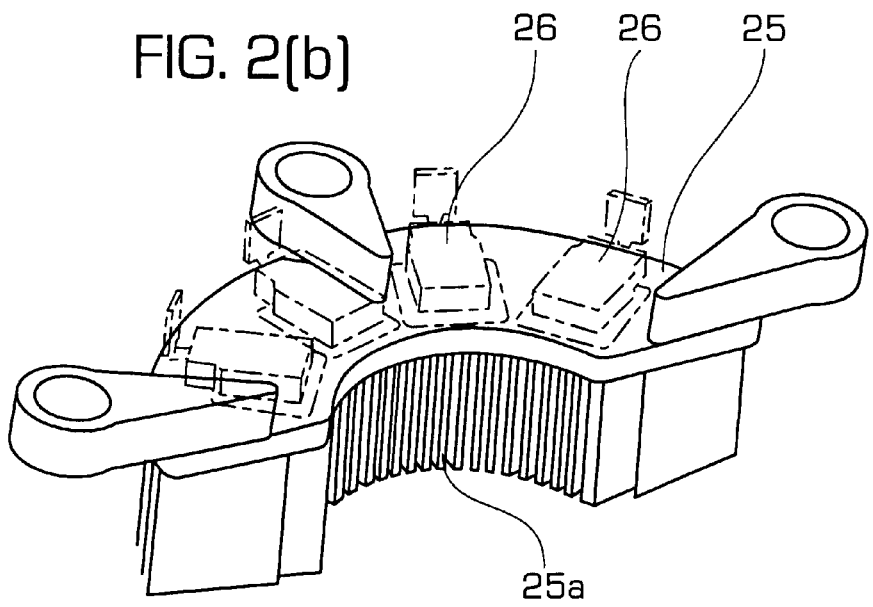

Likewise as to the plus side heat sink 25 of the rectifier too, as shown by FIG. 2(a), by arranging the insert members 36 correspondingly to the plus side and forming the heat sink body 35 through aluminum die-casting, attachment recessed portions 35a having a metal coating of a good solderability other than aluminum on their surfaces and having fins 25a can be obtained. Into respective attachment recessed portions 35a of the plus side heat sink 25, respective plus side diodes 26 are inserted and soldered and thus the plus side diodes 26 are fixed to the plus side heat sink 25.

In this way according to the Embodiment 1, when the formation of heat sinks 25, 27 of the rectifier 12 of alternating current generator for vehicles is performed portions to which diodes 26, 28 of the heat sinks 25, 27 are soldered are formed to be insert members 36, 38 with coating layers formed by galvanizing metal such as Ni and Cu having a good solderability other than aluminum onto the surfaces of the square shaped containers consisting of a material having a higher melting point than that of material consisting of heat sink body 35, 37 such as ADC10 and ADC12 and heat sinks 25, 27 are formed by means of insert die-casting.

As a result, not only surface coating is not required after formation by die-casting, but simplification of processes as well as improvement of productivity of the soldering works can be attained. Further, coating area can be put to be minimized, entailing a cost reduction.

Particularly plus side heat sink having large area due to fins 25a can be heavily affected advantageously.

Now, in Embodiment 1, the insert members 36, 38 are formed to be square containers which consist of material having melting point higher than that of material constituting the heat sink body 37 and on the surfaces of which coating layers are formed. On the other hand, the square containers may consist of a metal having a good solderability such as Ni and An other than aluminum, and those containers can be used as insert members 36, 38.

Embodiment 2

Figure 3:
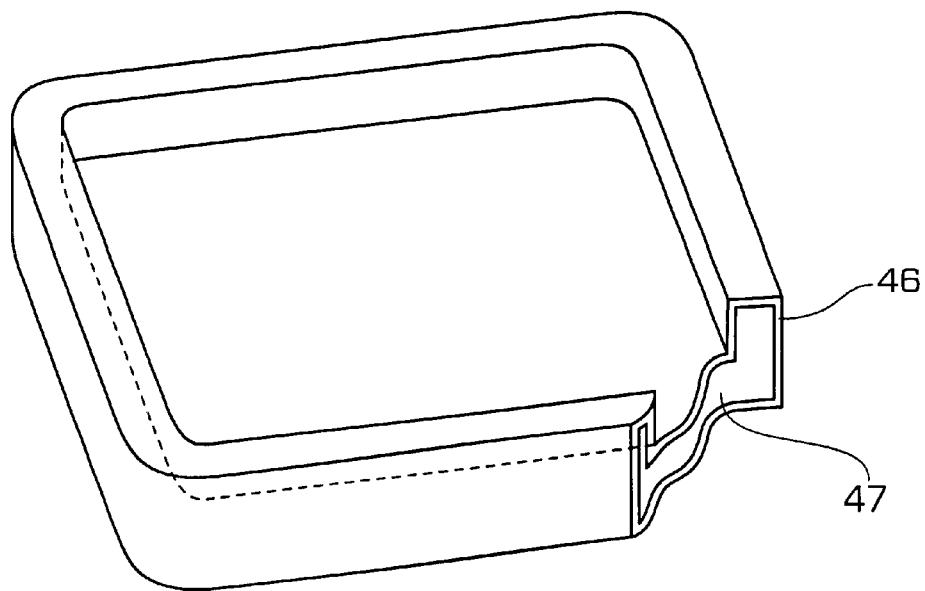
FIG. 3 is a perspective view of the insert member according to the Embodiment 2 of the present invention.
Figure 4:
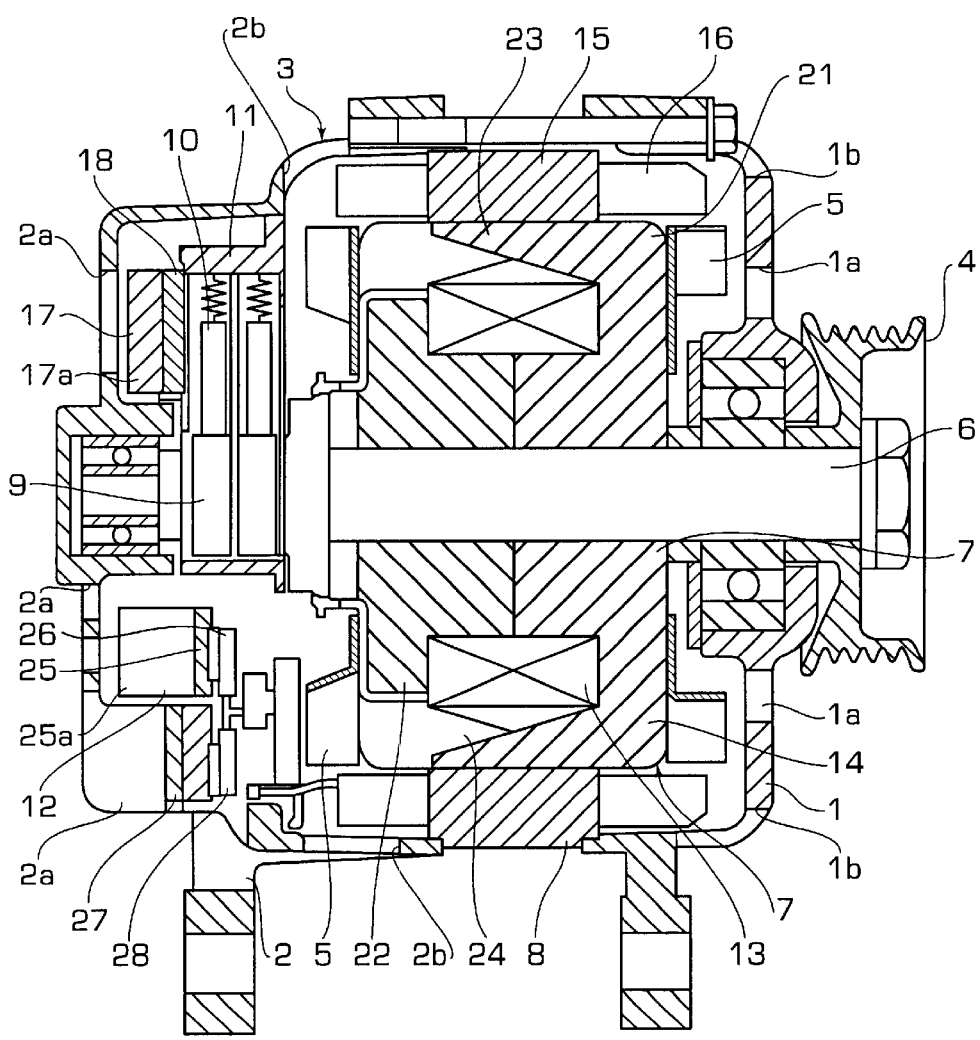
FIG. 4 is a sectional view showing conventional structure of the alternating current generator for a vehicle.
Figure 5:
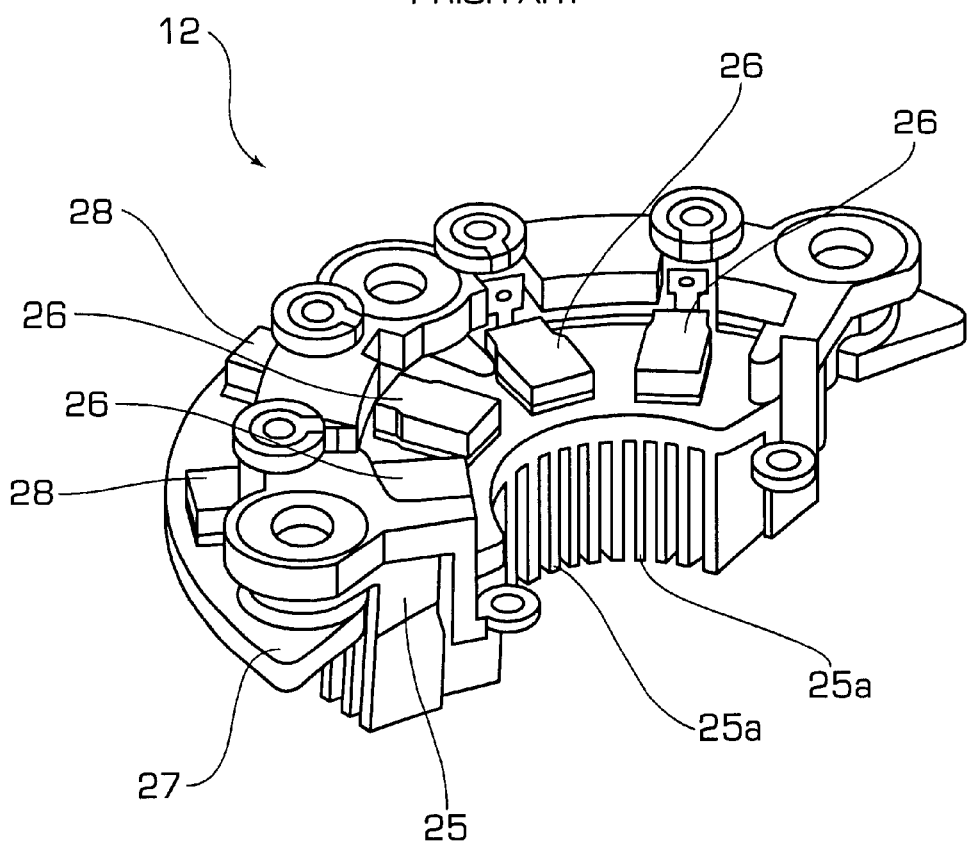
FIG. 5 is a perspective view showing a conventional rectifier.

In Embodiment 1, the insert members 36, 38 are members which consist of metal having good solderability such as Ni and Cu other than aluminum or metal having good solderability being adhesively coated onto a metal surface other than aluminum; but as shown by FIG. 3, by forming the insert member 46 by hyper-eutectic material 47, which has a higher melting point than that of ADC10 and ADC12 constituting the heat sink body and has an expansion coefficient approximately equal to that of ADC10 and ADC12, and onto the hyper-eutectic material 47 forming a coating layer (meshed portion) with metal plating having a good solderability such as Ni and Cu, the heat sink having a good adhesion with the material (ADC10, ADC12, etc) on the side of the heat sink body can be obtained.

That is, because the hyper-eutectic material 47 and the material constituting the heat sink body have approximately the same thermal expansion coefficients, even though the insert members and heat sinks are subjected to the heat cycle during die-casting forming, process the insert heat sink having a high quality with a good adhesion can be obtained.

According to the invention as recited in claim 1, as mentioned above the heat sinks for supporting diodes are formed through aluminum die-cast with members served as insert members in which each of member consists of a metal having a good solderability other than aluminum or consists of a metal having a good solderability being adhered onto a metal other than aluminum and at least a portion of each of heat sinks is formed to be that insert member. Hence coating area can be brought to minimum and as a result, even when heat sinks have large area, products having soldering coats with low cost can be obtained.

According to the invention as recited in claim 2, the insert members are formed by adhesively coating a metal having a good solderalibity onto a hyper-eutectic aluminum having a melting point higher than that of aluminum die-cast of the heat sink. Hence adhesion between the insert member and the heat sink body can be improved and aluminum insert products with high quality can be obtained.

What is claimed is:

1. A rectifier of an alternating current generator for a vehicle, said rectifier comprising:

a heat sink body formed from aluminum die-cast and having a mounting portion;

an insert member provided on said mounting portion; and a diode having, a mounting face from which side walls extend, said mounting face provided on said insert member, wherein said insert member
  (1) surrounds said side walls of said diode,
  (2) is one of (a) a metal having a good solderability other than aluminum and (b) a metal having a good solderability adhered onto a base metal other than aluminum, and
  (3) provides a solder connection between said diode and said heat sink body.

2. The rectifier according to claim 1, wherein said insert member is formed by adhesively coating a metal having a good solderability onto a hyper-eutectic aluminum having a melting point higher than that of aluminum die-cast of said heat sink body.

3. A rectifier of an alternating current generator for a vehicle, said rectifier comprising:

an insert die-cast body having a heat sink body formed from aluminum and die-cast onto an insert member; and a diode soldered to said insert member, wherein said insert member is one of (a) a metal having a good solderability other than aluminum and (b) a metal having a good solderability adhered onto a base metal other than aluminum.

4. The rectifier according to claim 3, wherein said insert member is formed by adhesively coating a metal having a good solderability onto a hyper-eutectic aluminum having a melting point higher than that of said heat sink body.

* * * * *